United States Patent
Cheung et al.

(10) Patent No.: US 9,184,705 B2
(45) Date of Patent: Nov. 10, 2015

(54) FEEDBACK MECHANISM FOR BOOST-ON-DEMAND AMPLIFIERS

(71) Applicant: Bose Corporation, Framingham, MA (US)

(72) Inventors: Shiufun Cheung, Lexington, MA (US); Jay Solomon, Stow, MA (US)

(73) Assignee: Bose Corporation, Framingham, MA (US)

( * ) Notice: Subject to any disclaimer, the term of this patent is extended or adjusted under 35 U.S.C. 154(b) by 202 days.

(21) Appl. No.: 14/078,613

(22) Filed: Nov. 13, 2013

(65) Prior Publication Data

US 2014/0270242 A1     Sep. 18, 2014

Related U.S. Application Data

(63) Continuation-in-part of application No. 13/832,837, filed on Mar. 15, 2013.

(51) Int. Cl.
*H03F 99/00* (2009.01)
*H03F 3/181* (2006.01)
*H03F 3/68* (2006.01)

(52) U.S. Cl.
CPC .............. *H03F 3/181* (2013.01); *H03F 3/68* (2013.01); *H03F 2200/435* (2013.01)

(58) Field of Classification Search
CPC .... H03F 3/68; H03F 2200/03; H04R 2499/13
USPC .............. 381/86, 120–121, 107–108
See application file for complete search history.

(56) References Cited

U.S. PATENT DOCUMENTS

| | | | |
|---|---|---|---|
| 5,161,097 A | 11/1992 | Ikeda | |
| 6,104,248 A | 8/2000 | Carver | |
| 6,191,567 B1 | 2/2001 | Sluijs | |

(Continued)

FOREIGN PATENT DOCUMENTS

| | | |
|---|---|---|
| DE | 19858963 A1 | 7/2000 |
| EP | 0279694 | 8/1988 |

(Continued)

OTHER PUBLICATIONS

"LTC3787-Polyphase Synchronous Boost Controller" by Linear Technology, Apr. 27, 2012; 36 pages.

(Continued)

*Primary Examiner* — Disler Paul
(74) *Attorney, Agent, or Firm* — Schmeiser, Olsen & Watts LLP

(57) ABSTRACT

A method and an amplifier for amplifying audio signals include a signal processor for processing incoming audio samples in preparation for amplification by an electronic amplifier circuit. A voltage is received from a power supply. Before the signal processor completes processing the incoming audio samples, an input level is estimated based on the incoming audio samples. In response to a comparison between the estimated input level and a threshold value, it is determined whether to boost the voltage received from the power supply. After the signal processor completes processing the incoming audio samples, an output level is estimated based on the processed audio samples. A determination is made, in response to the estimated output level, whether to adjust the threshold value used to determine whether to boost the voltage received from the power supply.

30 Claims, 11 Drawing Sheets

(56) References Cited

U.S. PATENT DOCUMENTS

| | | |
|---|---|---|
| 6,882,130 B2 | 4/2005 | Handa et al. |
| 7,482,869 B2 | 1/2009 | Wilson |
| 7,498,876 B2 | 3/2009 | Peruzzi et al. |
| 7,969,133 B2 | 6/2011 | Zhang et al. |
| 8,036,402 B2 * | 10/2011 | Furge .................. H03F 1/32 330/135 |
| 8,089,253 B2 | 1/2012 | Murtojarvi |
| 8,198,941 B2 | 6/2012 | Lesso |
| 2002/0153940 A1 | 10/2002 | Wurcer et al. |
| 2003/0107412 A1 | 6/2003 | Melsa |
| 2004/0125968 A1 | 7/2004 | Pearce et al. |
| 2008/0069385 A1 * | 3/2008 | Revit ............................ 381/321 |
| 2008/0100143 A1 | 5/2008 | Lipcsei |
| 2008/0144861 A1 | 6/2008 | Melanson et al. |
| 2009/0231030 A1 | 9/2009 | Li et al. |
| 2010/0321116 A1 | 12/2010 | Kim et al. |
| 2012/0262232 A1 | 10/2012 | Sukegawa et al. |
| 2013/0057342 A1 | 3/2013 | Zhu |
| 2013/0077806 A1 | 3/2013 | Zhang et al. |
| 2013/0083947 A1 * | 4/2013 | Moertel .................. H03F 13/00 381/120 |
| 2013/0108081 A1 | 5/2013 | Ozaki et al. |

FOREIGN PATENT DOCUMENTS

| | | |
|---|---|---|
| GB | 2043382 A | 10/1980 |
| GB | 236410 A | 9/2001 |
| JP | 5640307 A | 4/1981 |
| JP | 05267963 A | 10/1993 |
| WO | 2008024666 A2 | 2/2008 |
| WO | 2012172544 | 12/2012 |

OTHER PUBLICATIONS

International Search Report and Written Opinion in related International Patent Application No. PCT/US14/64277, mailed on Mar. 9, 2015; 9 pages.

Non-Final Office Action in related U.S. Appl. No. 13/832,837, mailed on Mar. 24, 2015; 11 pages.

Notice of Allowance in Related U.S. Appl. No. 13/832,837, mailed on Jul. 6, 2015; 5 pages.

* cited by examiner

FEEDBACK MECHANISM FOR BOOST-ON-DEMAND AMPLIFIERS

RELATED APPLICATION

This application is a continuation-in-part application of U.S. application Ser. No. 13/832,837, filed Mar. 15, 2013, titled "Boost-on-demand Amplifier", the entirety of which application is incorporated by reference herein.

BACKGROUND

This specification relates generally to audio systems, and, more specifically, to audio systems with amplifiers that use a boost supply to amplify audio signals.

SUMMARY

All examples and features mentioned below can be combined in any technically possible way.

In one aspect, a method for amplifying audio signals includes processing, by a signal processor, an incoming audio sample in preparation for amplification by an electronic amplifier circuit, receiving a voltage from a power supply, estimating, before the signal processor completes processing the incoming audio samples, an input level based on the incoming audio samples, determining, in response to a comparison between the estimated input level and a threshold value, whether to boost the voltage received from the power supply, estimating, after the signal processor completes processing the incoming audio samples, an output level based on the processed audio samples, and determining, in response to the estimated output level, whether to adjust the threshold value used to determine whether to boost the voltage received from the power supply.

Embodiments may include one of the following features, or any combination thereof. The threshold value can be a first threshold value and the method determines whether to adjust the threshold value by comparing the estimated output level with a second threshold value to determine whether the processed audio samples warrant a boosting of the voltage received from the power supply, comparing a result of the comparison between the estimated output level and the second threshold value with a result of the comparison between the estimated input level and the first threshold value, and adjusting the first threshold value if the results differ.

Further, the method can further comprise increasing the first threshold value if the result of the comparison between the estimated input level and the first threshold value indicates boosting of the voltage received from the power supply is warranted, but the result of the comparison between the estimated output level and the second threshold value indicates boosting of the voltage received from the power supply is unwarranted. the method can further comprise reducing the first threshold value if the result of the comparison between the estimated input level and the first threshold value indicates boosting of the voltage received from the power supply is unwarranted, but the result of the comparison between the estimated output level and the second threshold value indicates boosting of the voltage received from the power supply is warranted.

In addition, the threshold value can be a first threshold value and the method further estimates a plurality of input levels and a plurality of output levels. Each estimated input level is determined from a frame of incoming audio samples and each estimated output level is determined from a frame of processed audio samples. Further, determining whether to adjust the first threshold value comprises: comparing each estimated input level with the first threshold value to determine whether the frame of incoming audio samples from which that estimated input level is determined warrants a boosting of the voltage received from the power supply; comparing each estimated output level with a second threshold value to determine whether the frame of processed audio samples from which that estimated output level is determined warrants a boosting of the voltage received from the power supply; comparing a window of results of the comparisons between the estimated output levels and the second threshold value with a window of results of the comparisons between the estimated input levels and the first threshold value; and adjusting the first threshold value if one or more results in one window of results indicate boosting of the voltage is warranted, whereas all results in the other window of results indicate boosting of the voltage is unwarranted.

Also, the method can further comprise increasing the first threshold value if one or more results in the window of results of the comparisons between the estimated input levels and the first threshold value indicates boosting of the voltage received from the power supply is warranted, but all results in the window of results of the comparisons between the estimated output levels and the second threshold value indicate boosting of the voltage received from the power supply is unwarranted. In another embodiment, the method can further comprise reducing the first threshold value if one or more results in the window of results of the comparisons between the estimated input levels and the first threshold value indicates boosting of the voltage received from the power supply is unwarranted, but all results in the window of results of the comparisons between the estimated output level and the second threshold value indicates boosting of the voltage received from the power supply is warranted.

The method can further comprise determining the threshold value based on tuning equalization of a plurality of electronic amplifier circuits configured to receive a boosted voltage. In another embodiment, the estimating of an input level based on the incoming audio samples comprises determining a maximum input level from among the incoming audio samples. This estimating of the input level based on the incoming audio samples can further comprise adding a volume level to the maximum input level. In yet another embodiment, the method can comprise boosting the voltage received from the power supply and supplying the boosted voltage to the electronic amplifier circuit if the estimated input level is greater than the threshold value, and otherwise passing the voltage received from the power supply to the electronic amplifier circuit.

In another aspect, the invention features an amplifier comprising an electronic amplifier circuit and a boost supply circuit receiving a voltage from a power supply. The boost supply circuit communicates with the electronic amplifier circuit to provide power thereto. The amplifier further comprises a processor system processing an incoming audio sample to be amplified by the electronic amplifier circuit. The processor system includes an input level detector, an output level detector, and a processor. The input level detector produces an input level estimate based on the incoming audio samples before the processor system completes the processing of the incoming audio samples. The output level detector produces an output level estimate, after the processor system completes the processing of the incoming audio samples, based on the processed audio samples, and the processor determines, in response to a comparison between the estimated input level and a threshold value, whether to boost the voltage received from the power supply, and, in response to the estimated output level, whether to adjust this threshold value.

Embodiments of the amplifier may include one of the following features, or any combination thereof.

In one embodiment, the threshold value is a first threshold value and the processor determines whether to adjust the first threshold value by comparing the estimated output level with a second threshold value to determine whether the processed audio samples warrant a boosting of the voltage received from the power supply, comparing a result of the comparison between the estimated output level and the second threshold value with a result of the comparison between the estimated input level and the first threshold value, and adjusting the first threshold value if the results differ. The processor can increase the first threshold value if the result of the comparison between the estimated input level and the first threshold value indicates boosting of the voltage received from the power supply is warranted, but the result of the comparison between the estimated output level and the second threshold value indicates boosting of the voltage received from the power supply is unwarranted. The processor can reduce the first threshold value if the result of the comparison between the estimated input level and the first threshold value indicates boosting of the voltage received from the power supply is unwarranted, but the result of the comparison between the estimated output level and the second threshold value indicates boosting of the voltage received from the power supply is warranted.

In other embodiments, the threshold value is a first threshold value, the input level detector produces a plurality of input level estimates, and the output level detector produces a plurality of output level estimates. Each input level estimate is determined from a frame of incoming audio samples and each output level estimate is determined from a frame of processed audio samples. The processor determines whether to adjust the first threshold value by comparing each estimated input level with the first threshold value to determine whether the frame of incoming audio samples from which that estimated input level is determined warrants a boosting of the voltage received from the power supply, comparing each estimated output level with a second threshold value to determine whether the frame of processed audio samples from which that estimated output level is determined warrants a boosting of the voltage received from the power supply, comparing a window of results of the comparisons between the estimated output levels and the second threshold value with a window of results of the comparisons between the estimated input levels and the first threshold value, and adjusting the first threshold value if one or more results in one window of results indicate boosting of the voltage is warranted, whereas all results in the other window of results indicate boosting of the voltage is unwarranted.

The processor can increase the first threshold value if one or more results in the window of results of the comparisons between the estimated input levels and the first threshold value indicates boosting of the voltage received from the power supply is warranted, but all results in the window of results of the comparisons between the estimated output levels and the second threshold value indicate boosting of the voltage received from the power supply is unwarranted. The processor can reduce the first threshold value if one or more results in the window of results of the comparisons between the estimated input levels and the first threshold value indicates boosting of the voltage received from the power supply is unwarranted, but all results in the window of the comparisons between the estimated output level and the second threshold value indicates boosting of the voltage received from the power supply is warranted.

In other embodiments, the threshold value can be determined based on tuning equalization of a plurality of electronic amplifier circuits configured to receive a boosted voltage. The input level detector can estimate an input level based on the incoming audio samples by determining a maximum input level from among the incoming audio samples, and further estimate the input level based on the incoming audio samples by adding a volume level to the maximum input level.

In still another embodiment, the boost supply circuit boosts the voltage received from the power supply and supplies the boosted voltage to the electronic amplifier circuit if the estimated input level is greater than the threshold value, and otherwise passes the voltage received from the power supply to the electronic amplifier circuit.

In still another aspect, the invention features an automotive vehicle comprising an input source of incoming audio samples, a power supply supplying a voltage, and an amplifier in communication with the input source to receive the incoming audio samples therefrom and with the power supply to receive the voltage. The amplifier comprises an electronic amplifier circuit and a boost supply circuit receiving a voltage from a power supply. The boost supply circuit communicates with the electronic amplifier circuit to provide power thereto. A processor system processes the incoming audio samples in preparation for amplification by the electronic amplifier circuit. The processor system includes an input level detector, an output level detector, and a processor. The input level detector produces an input level estimate based on the incoming audio samples before the processor system completes the processing of the incoming audio samples. The output level detector produces an output level estimate, after the processor system completes the processing of the incoming audio samples, based on the processed audio samples, and the processor determines, in response to a comparison between the estimated input level and a threshold value, whether to boost the voltage received from the power supply, and, in response to the estimated output level, whether to adjust this threshold value.

Embodiments of the automotive vehicle may include one of the following features, or any combination thereof.

In one embodiment, the threshold value is a first threshold value and the processor determines whether to adjust the first threshold value by comparing the estimated output level with a second threshold value to determine whether the processed audio samples warrant a boosting of the voltage received from the power supply, comparing a result of the comparison between the estimated output level and the second threshold value with a result of the comparison between the estimated input level and the first threshold value, and adjusting the first threshold value if the results differ. The processor can increase the first threshold value if the result of the comparison between the estimated input level and the first threshold value indicates boosting of the voltage received from the power supply is warranted, but the result of the comparison between the estimated output level and the second threshold value indicates boosting of the voltage received from the power supply is unwarranted. The processor can reduce the first threshold value if the result of the comparison between the estimated input level and the first threshold value indicates boosting of the voltage received from the power supply is unwarranted, but the result of the comparison between the estimated output level and the second threshold value indicates boosting of the voltage received from the power supply is warranted.

In other embodiments, the threshold value is a first threshold value, the input level detector produces a plurality of input level estimates, and the output level detector produces a plurality of output level estimates. Each input level estimate is determined from a frame of incoming audio samples and each output level estimate is determined from a frame of processed audio samples. The processor determines whether to adjust the first threshold value by comparing each estimated input level with the first threshold value to determine whether the frame of incoming audio samples from which that estimated input level is determined warrants a boosting of the voltage received from the power supply, comparing each estimated output level with a second threshold value to determine whether the frame of processed audio samples from which that estimated output level is determined warrants a boosting of the voltage received from the power supply, comparing a window of results of the comparisons between the estimated output levels and the second threshold value with a window of results of the comparisons between the estimated input levels and the first threshold value, and adjusting the first threshold value if one or more results in one window of results indicate boosting of the voltage is warranted, whereas all results in the other window of results indicate boosting of the voltage is unwarranted.

The processor can increase the first threshold value if one or more results in the window of results of the comparisons between the estimated input levels and the first threshold value indicates boosting of the voltage received from the power supply is warranted, but all results in the window of results of the comparisons between the estimated output levels and the second threshold value indicate boosting of the voltage received from the power supply is unwarranted.

The processor can reduce the first threshold value if one or more results in the window of results of the comparisons between the estimated input levels and the first threshold value indicates boosting of the voltage received from the power supply is unwarranted, but all results in the window of results of the comparisons between the estimated output level and the second threshold value indicates boosting of the voltage received from the power supply is warranted.

In other embodiments, the threshold value can be determined based on tuning equalization of a plurality of electronic amplifier circuits configured to receive a boosted voltage. The input level detector can estimate an input level based on the incoming audio samples by determining a maximum input level from among the incoming audio samples, and further estimate the input level based on the incoming audio samples by adding a volume level to the maximum input level.

In still another embodiment, the boost supply circuit boosts the voltage received from the power supply and supplies the boosted voltage to the electronic amplifier circuit if the estimated input level is greater than the threshold value, and otherwise passes the voltage received from the power supply to the electronic amplifier circuit.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
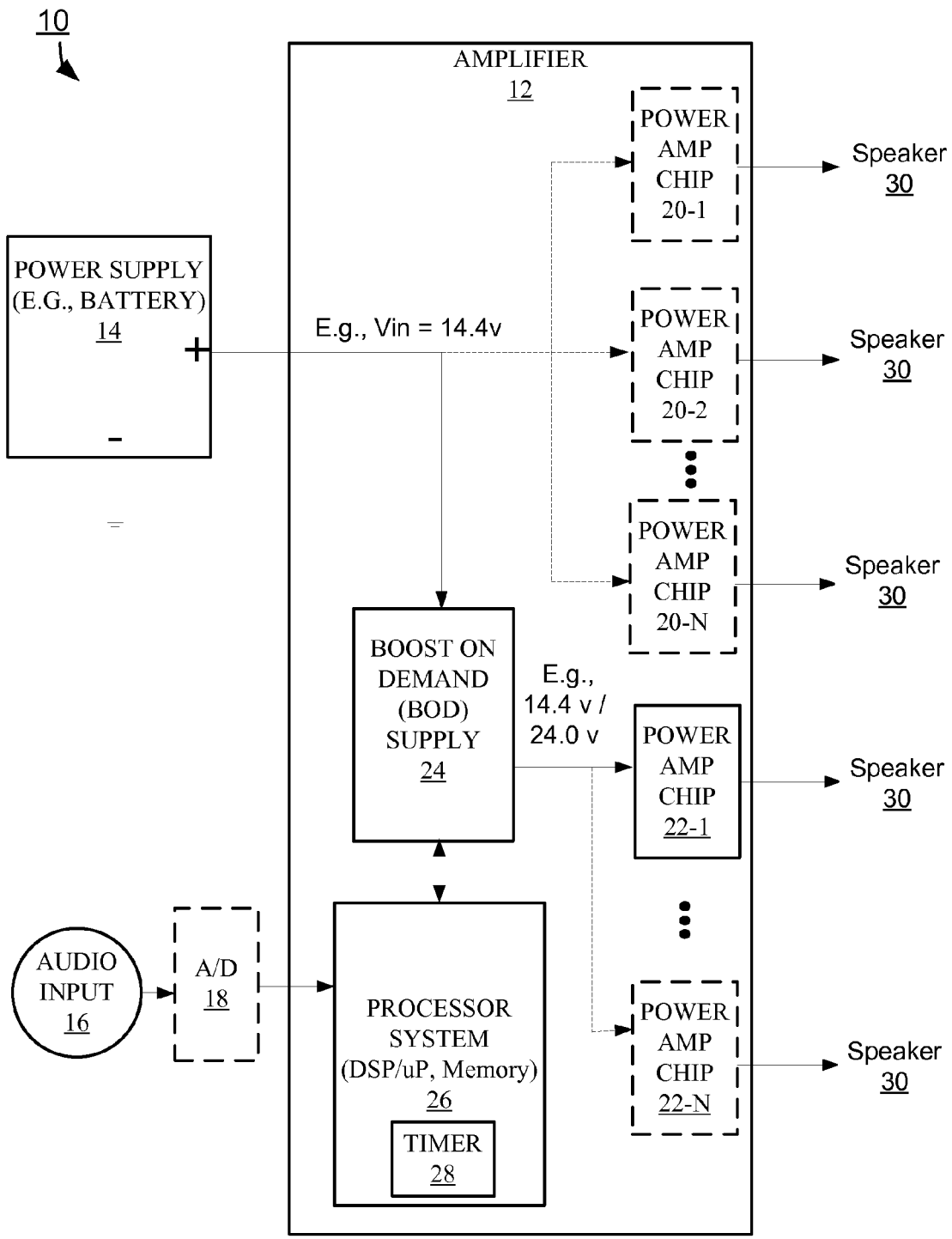
FIG. 1 is a block diagram of an embodiment of a boost-on-demand system including an amplifier in communication with a power supply, an input source, and a plurality of speakers.

Boost-on-demand (BOD) systems described herein include an amplifier configured to reduce power drawn from a power supply, such as a battery or a car alternator, by using a boost supply that shuts off when the output level is low enough not to require boosting, and turns on automatically when the output level requires the extra power. In brief overview, these boost-on-demand systems can decide whether to boost power or to just pass through battery power based on the amplitude of the incoming audio signals and the setting of the volume control of the amplifier. The BOD system adds the amplitude value of the incoming audio sample (in dB Full Scale or dBFS) to the volume setting (in dBFS) of the amplifier and, optionally, a predetermined calibration value, and compares the sum to a threshold. If the sum exceeds the threshold, the BOD system turns on the boost supply; otherwise, the BOD system passes the battery voltage to the one or more power amplifiers. The threshold can initially be predetermined, tuned to match the equalization of the boosted channels, or on a feedback mechanism, as described herein. Each BOD system establishes its own threshold.

In addition, decisions whether to boost the voltage occur at the front end of the digital signal processing pipeline, before a digital signal processor completely processes the incoming audio signals. The audio processing, from incoming audio samples to outgoing audio, incurs a delay. In some amplifiers, this delay can be as long as 50 ms. This latency incurred by the digital signal processing provides a window of time within which a decision to boost may be made, and within which the voltage can ramp from the battery voltage to the boost voltage. Consider, for example, that the voltage supplied to the power amplifier takes 5 ms to rise from a battery voltage of 14.4 volts to a boost voltage of 24 volts. For an amplifier that incurs a 50 ms processing delay, the boost voltage has an additional 45 ms to settle before a power amplifier converts the audio sample that triggered the boost into audio. Thus, the BOD system capitalizes on the delay to "predict" whether a given incoming audio sample (or group of samples) requires boosting, and to ensure the boost voltage is delivered and stable before the audio processing of that sample(s) is completed.

Other amplifiers may incur shorter or longer delays than 50 ms, and other BOD systems may have shorter and longer voltage rise times; the salient criteria is that the processing delay be sufficiently long for the BOD system to render the boost decision for an audio sample, and then for the voltage to rise to the boost voltage to power amplification of that audio sample. After an incoming audio sample triggers the boost supply to turn on, a built-in timer keeps the boost supply on for a minimum duration (e.g., 160 ms), to avoid hysteresis that may result from switching the boost supply on and off too frequently.

The threshold used to make the boost decisions may be raised or lowered dynamically using an automatic feedback mechanism that fine-tunes the threshold. (This same feedback mechanism can also be used initially to tune the boost threshold during the calibration process.) In brief overview, the feedback mechanism entails the use of an output level detector disposed at the back end of the digital signal-processing pipeline, where the processed audio signals emerge, and where the output level detector determines the "actual" necessity of boosting the voltage based on the levels of the processed audio signals. Although this determination occurs too late in the signal processing chain to make a boost decision for these processed audio signals, the results can be used to improve the accuracy of future boost decisions. The determination made from the output level estimate produced by this output level detector is compared with the decision made at the front end of the digital signal processing. Ideally, comparisons should be between front end decisions and back end determinations made on the same frame (or set) of audio samples. Accordingly, such comparisons entail a timing alignment. Tolerances can be built into this timing alignment by comparing multiple (i.e., a window of) front end decisions with multiple (i.e., a window of) back end determinations.

Advantageously, the BOD system can also be configured to operate as a holdup supply when the battery voltage drops below a specified level. Typically, when the BOD system determines not to boost, it operates to pass the battery voltage through to the one or more power amplifiers. If the battery voltage is below this specified level, the boost supply holds the voltage at that specified level.

FIG. 1 shows an embodiment of a boost-on-demand (BOD) system 10 that can operate within, for example, a vehicle. The BOD system 10 includes an amplifier 12 in communication with a power supply 14 and with an input source 16 of audio signals. The power supply 14 (typically, a battery or an alternator of the automotive vehicle) provides a particular voltage (e.g., 14.4 volts), also referred to as a battery voltage. The positive terminal (+) of the power supply 14 connects to amplifier 12; the negative terminal (−), to the system ground (e.g., the chassis of the vehicle). The input source 16 can be, for example, an RF (radio frequency) receiver that provides analog audio signals. An analog-to-digital (A/D) signal converter 18 can convert such signals from the input source into digital audio samples, and provide the digital signals to the amplifier 12. Although shown separate from the amplifier 12, the A/D converter 18 can be part of the amplifier 12. Alternatively, the input source 16 can be a digital audio source, for example, a CD player, that passes digital audio samples directly to the amplifier 12.

The amplifier 12 includes a plurality of power amplifier chips 20-1, 20-2, 20-N, 22-1, 22-N (also referred to as electronic amplifier circuits), a BOD supply 24, a processor system 26. The processor system 26 includes a timer 28. In one embodiment, each of the power amplifier chips 20, 22 is a class-D amplifier (i.e., switching amplifier). Each power amplifier chip 20-1, 20-2, 20-N, 22-1, 22-N is in communication with at least one speaker 30, and corresponds to a separate channel. Each speaker 30 may be selected for the particular frequencies of the channel for which that speaker is used. The power supply 14 is in electrical communication with each power amplifier chip 20-1, 20-2, 20-N (generally, 20) and with the BOD supply 24.

The BOD supply 24 is in electrical communication with the one or more power amplifier chips 22-1, 22-N (generally, 22). Each of these power amplifier chips 22 corresponds to a boosted output or channel. The BOD supply 24 is configured to pass through the battery voltage (e.g., 14.4 V) or to supply a boosted voltage (e.g., 24 V) to the one or more power amplifier chips 22, as later described in more detail.

The different reference numerals (20, 22) given to the power amplifier chips are herein used to distinguish between those power amplifier chips 22 that are configured to receive a boosted voltage from the BOD supply 24, and those power amplifier chips 20 that are not. In addition, although FIG. 1 shows a plurality of power amplifier chips 20-1, 20-2, 20-N, other embodiments can have zero or only one power amplifier chip 20 in electrical communication with the power supply 14.

The processor system 26 includes the computing resources of the amplifier 12. In one embodiment, the processor system 26 includes a digital signal processor, a microprocessor (or microcontroller), and memory. The digital signal processor processes the digital audios samples arriving from the A/D converter 18 (or, directly from the input source 16 if the input source is a digital audio source), and the microprocessor performs the switching of the BOD supply 24 on and off in accordance with program code stored in the memory. In other embodiments, the functionality of the DSP and the microprocessor can be combined in a single processor. The timer 28, which can be part of the DSP, is set to a value corresponding to the minimum duration for which the BOD supply 24 stays turned on; that is, to avoid turning the BOD supply 24 off too soon after being turned on, thereby potentially producing unwanted hysteresis. This minimum duration can also serve to give the microprocessor sufficient time to complete various monitoring functions. In one embodiment, this timer is set to 160 ms.

Figure 2:
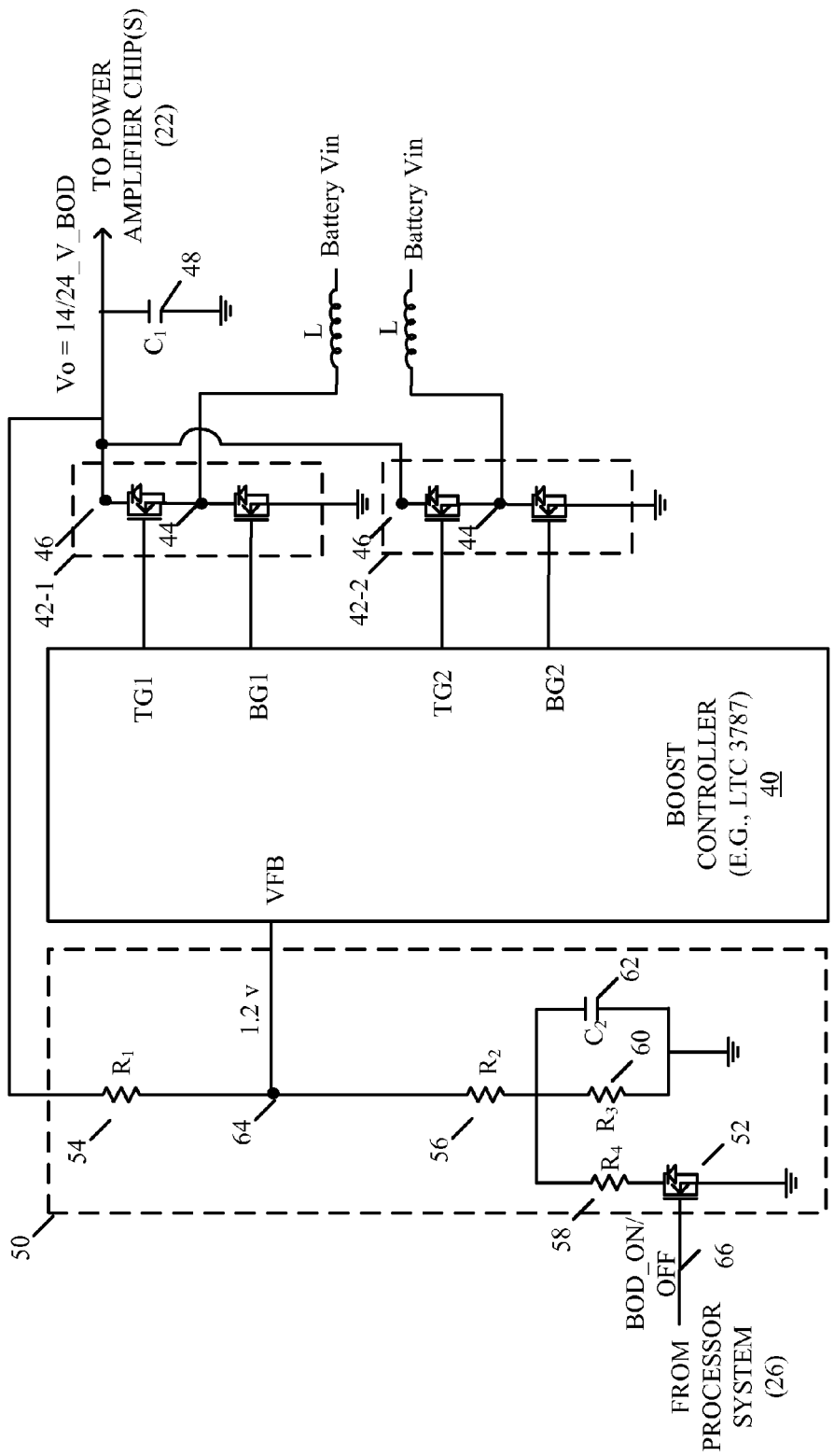
FIG. 2 is a simplified circuit diagram of an embodiment of a boost-on-demand (BOD) supply circuit.

FIG. 2 shows an embodiment of the BOD supply 24 including a boost controller chip 40 for producing the boost voltage and supplying the boosted voltage to the power amplifier chips 22 on demand. In this embodiment, the boost controller chip 40 is implemented with an LTC3787 Polyphase Synchronous Boost Controller device, produced by Linear Technology Corporation of Milpitas, Calif. Other boost controller chips can be used without departing from the principles described herein. The pins of the boost controller chip 40 include a TG1 (Top Gate1) pin, a BG1 (Bottom Gate 1), a TG2 (Top Gate2) pin, a BG2 (Bottom Gate 2) pin, and a VFB (Regulated Feedback Voltage) pin. For simplicity sake, not every pin of the boost controller chip 40 is shown or described.

The TG1 and BG1 pins are connected to the top and bottom gates, respectively, of a first pair 40-1 of synchronous N-channel MOSFETs; the TG2 and BG2 pins are connected to the top and bottom gates, respectively, of a second pair 40-2 of synchronous N-channel MOSFETs. The center node 44 between the top and bottom gates of each synchronous N-channel MOSFET pair 40-1, 40-2 is connected to the battery voltage (Vin) through an inductor (L). The source node 46 of the top gate of each synchronous N-channel MOSFET pair 40-1, 40-2 is connected to the output (Vo) of the BOD supply 24. A capacitor ($C_1$) 48 is connected to the output (Vo). Preferably, the size of the capacitor ($C_1$) 48 is less than or equal to 5000 µF. This output (Vo) is fed back to the VFB pin of the boost controller chip 40. In accordance with the operation of BOD supply 24, the output (Vo) is a regulated DC voltage that switches between the battery voltage (Vin, e.g., 11V) and the boost voltage (e.g., 24.0 V). In some instances, the output (Vo) can be held at a hold-up voltage, as described later in more detail.

A resistive divider circuit 50, connected to the output (Vo) and to the VFB pin of the boost controller chip 40, controls the switching between the battery voltage (Vin) and the boost voltage. The circuit 50 includes a MOSFET 52, a first resistor ($R_1$) 54, a second resistor ($R_2$) 56, a third resistor ($R_3$) 58, a fourth resistor ($R_4$) 60, and a capacitor ($C_2$) 62. The first resistor ($R_1$) 54 and second resistor ($R_2$) 56 are connected in series. The node 64 between the first resistor ($R_1$) 54 and second resistor ($R_2$) 56 is connected to the VFB pin. The third resistor ($R_3$) 58, fourth resistor ($R_4$) 60, and a capacitor ($C_2$) 62 are connected in parallel. The fourth resistor ($R_4$) 60 is also connected to the source of the MOSFET 52.

Connected to the gate of the MOSFET 52 is the processor system 26, which sends high and low signals over a BOD_ON/OFF signal line 66, to turn the MOSFET 52 on and off, respectively. The circuit 50 provides a voltage divider; the resulting voltage at node 64 depends on the on/off state of the MOSFET 52. When the MOSFET 52 is turned on, by a high signal arriving at its gate over the BOD_ON/OFF signal line 66, the resistance of the fourth resistor ($R_4$) 60 factors into the resulting voltage on the node 64. When the MOSFET 52 is turned off, by a low signal arriving at its gate over the BOD_ON/OFF signal line 66, the resistance of the fourth resistor ($R_4$) 60 is effectively removed from the voltage divider operation.

The values of the various components of the circuit 50 are selected to provide a boost voltage (e.g., approximately 24 volts) when the MOSFET 52 is on and to pass through the battery voltage when the MOSFET 52 is off. The circuit 50 also produces a hold-up voltage (e.g., approximately 10 volts) in the event the battery voltage drops below a certain level. This hold-up voltage is less than the input voltage expected to be supplied by the battery. Normally, when the input voltage (Vin) is greater than the output voltage (Vo), such as when the boost controller 40 is not boosting, the boost controller 40 passes the input voltage (Vin) through to the output. Accordingly, if the battery voltage (Vin) is greater than the hold-up voltage, as it typically is, the battery voltage is passed to the output. If the battery voltage, however, drops below this hold-up voltage, the boost controller 40 regulates the output (Vo) to the hold-up voltage. If the MOSFET 52 is turned on, and the boost controller 40 is boosting the voltage, the output (Vo) is regulated to the boost voltage irrespective of whether the input voltage (Vin) is above or below the hold-up voltage.

The values of the various components of the circuit 50 are also selected to produce a particular rise rate of the output voltage (Vo) when switching from the battery voltage to the boost voltage. For the boost voltage to be available at the power amplifier 22 in time to amplify a given incoming audio sample, the voltage needs to ramp from the battery voltage to the boost voltage before the processor system 26 completes processing the incoming audio sample. Preferably, the voltage can ramp from the battery voltage to the boost voltage within 20 ms, leaving approximately 30 ms for the voltage to settle at the boost voltage level. In one embodiment that achieves these objectives, the value of the first resistor ($R_1$) 54 is 90.9K, the value of the second resistor ($R_2$) 56 is 2.49K, the value of the third resistor ($R_3$) 58 is 9.09K, the value of the fourth resistor ($R_4$) 60 is 3.32K, and the value of the capacitor ($C_2$) 62 is 2.2 µF. This particular combination of component values produces a hold-up voltage of approximately 10 v at the output (Vo). If the voltage supplied by power supply (Vin) is less than the hold-up voltage, the BOD supply 24 boosts the voltage supplied by power supply to produce the hold-up voltage at the output (Vo). Other combinations of component values can be used to achieve the above-noted objectives of target boost and hold-up voltage levels and ramp rate.

Figure 3:
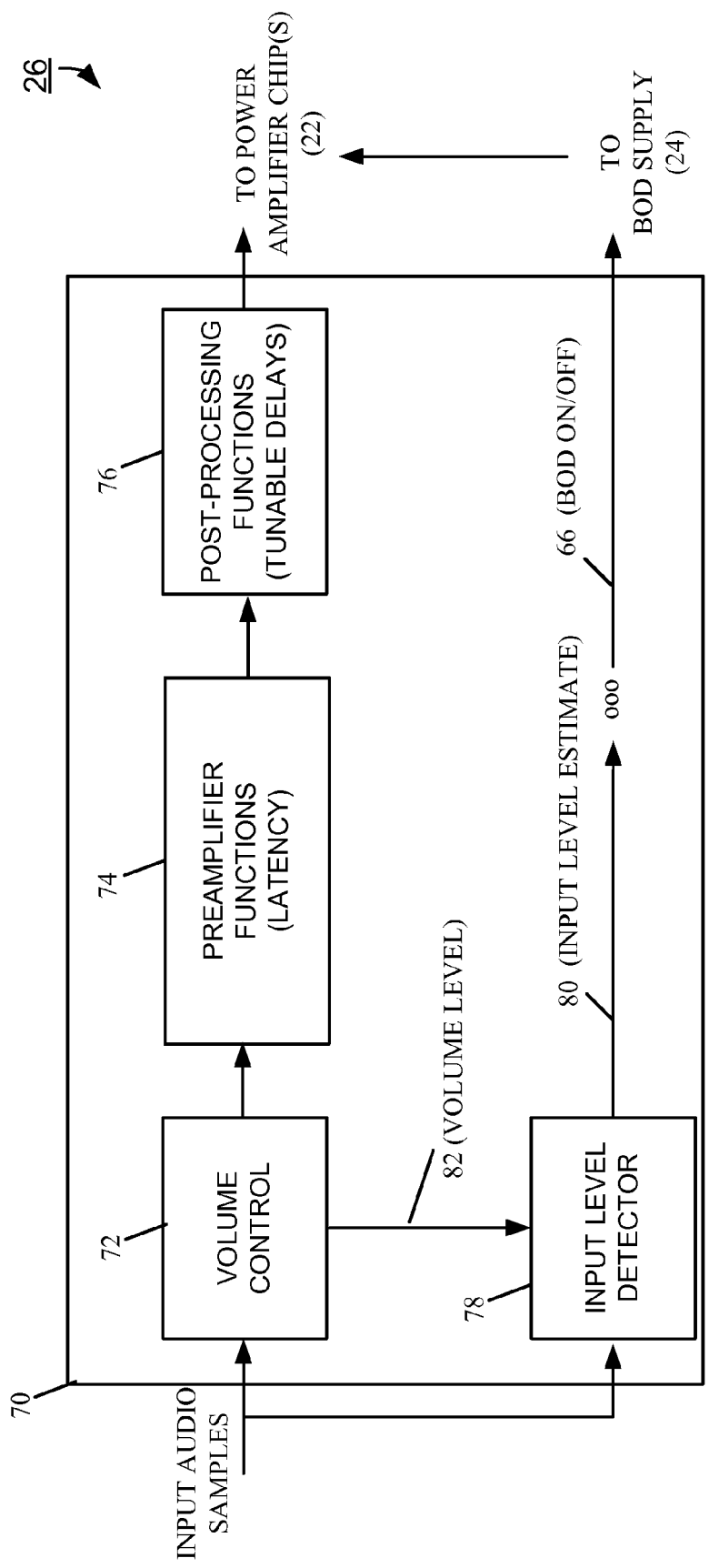
FIG. 3 is a block diagram of an embodiment of a processor system comprising a signal-processing pipeline having an input level detector configured to produce an input level estimate used to trigger (i.e., boost enable signal) the BOD supply circuit of FIG. 2.

FIG. 3 shows an embodiment of the processor system 26 comprising a signal-processing pipeline 70 that includes a volume control module 72, preamplifier functions module 74, a post-processing functions module 76, and an input level detector 78. Incoming input audio samples pass to the volume control module 72 and to the input level detector 78. The volume control module 72 determines a volume level at which audio samples are to be played. The input level detector 78 receives the volume level from the volume control module 72 and uses this volume setting to produce an input level estimate based on the incoming input audio samples. The processor system 26 uses this input level estimate to determine whether to turn on the boost supply 24 (via the BOD_ON_OFF signal 66). The preamplifier functions module 74 and post-processing functions module 76, which can be embodied in a digital signal processor, perform the digital signal processing of the audio signals, as is known in the art. The signal processing performed by the preamplifier functions module 74 has inherent latency; the signal processing of the post-processing functions module 76 has tunable delays. The output audio signals from the post-processing functions module 76 pass to the power amplifier chips 22 for audio output over the speakers 30.

Figure 4:
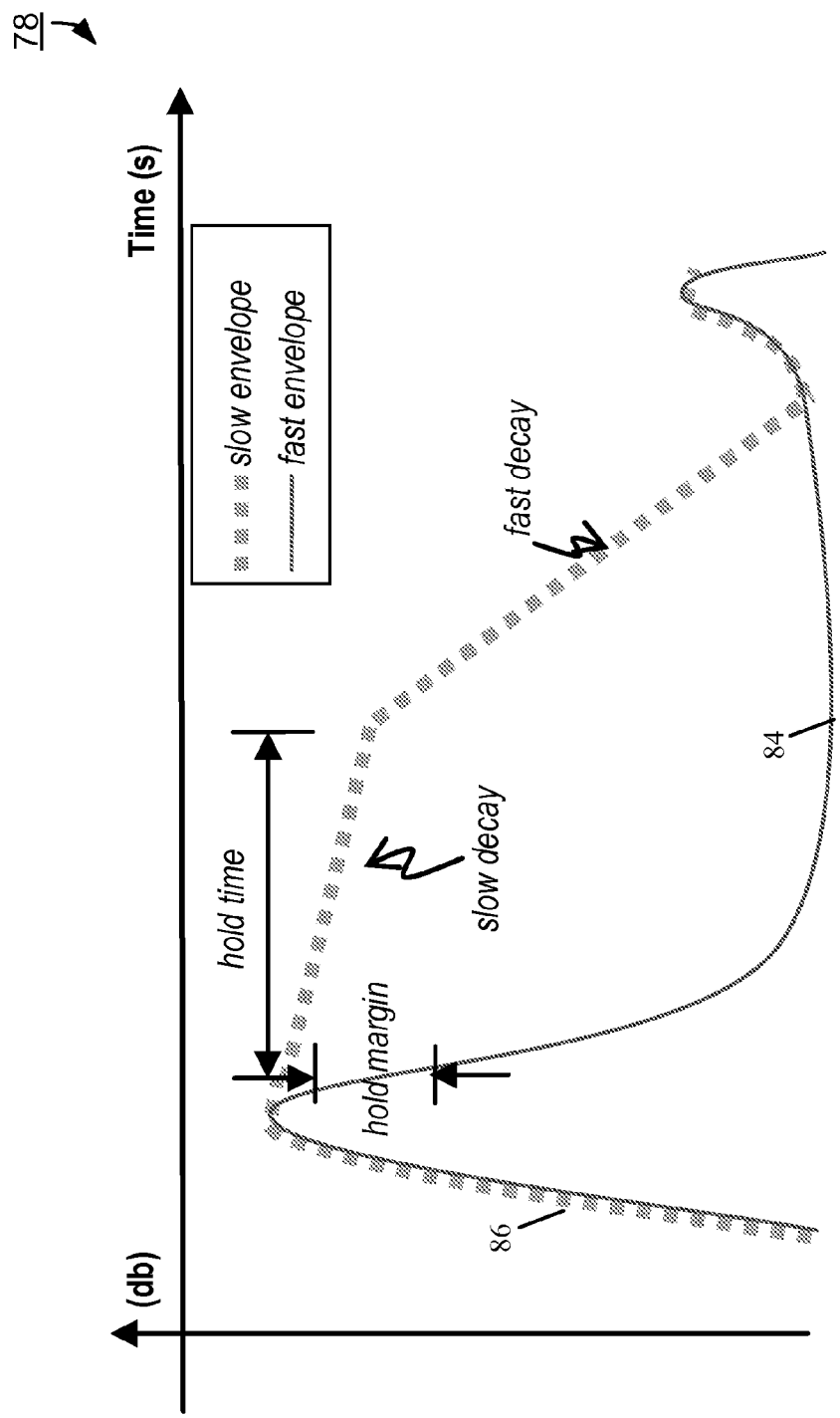
FIG. 4 is a graph of signal level over time illustrating an example of the operation of the input level detector.

FIG. 4 graphically shows the operation of the input level detector 78 to produce an input level estimate from incoming audio samples. The operation entails three steps: first, the input level detector 78 performs a "fast" determination 84 of the level by taking the maximum absolute value of a frame of incoming audio samples associated with one or more boosted audio channels. For example, a 32-sample frame associated with two audio channels has 16 audio samples for each of the two audio channels. This level estimate, which corresponds to the maximum value in the frame, is in units of dB, and may be referred to as a "fast envelope."

Second, the input level detector 78 performs a "slow" conditioned output 86 based on the "fast" envelope 84. The level estimate produced from this slow output is used by the processor system 26 (FIG. 1) to make threshold comparisons and thereby determine whether to turn on the boost supply 24 (via the BOD_ON_OFF signal 66). The output 86 of the input level detector 78 rises with the fast envelope 84 when the fast envelope 84 is greater than the current output without any damping or delay. For cases where the fast envelope 84 is less than the current output, the output 86 of the input level detector 78 drops at the slow decay rate. If the fast envelope 84 remains below the output 86 by at least the time period (in sec), indicated by a hold time, and the fast envelope 84 is below the current output 86 by at least the amount indicated in a hold margin, then the detector output 86 drops at the fast decay rate until the output 86 is again equal to the current fast envelope 84. The peak level estimate determined from the output 86, also referred to as a "slow envelope", is in units of dB relative to full-scale input, and therefore its value is negative.

Third, the input level detector 78 converts the level estimates (slow and fast envelope) in dB to estimated dBSPL values, which represents the sound intensity as perceived in the surrounding environment (e.g., a vehicle). The conversion includes the application of two offsets, a volume control setting 82 (FIG. 3), and the maximum output (in dBSPL) of the amplifier.

Figure 5:
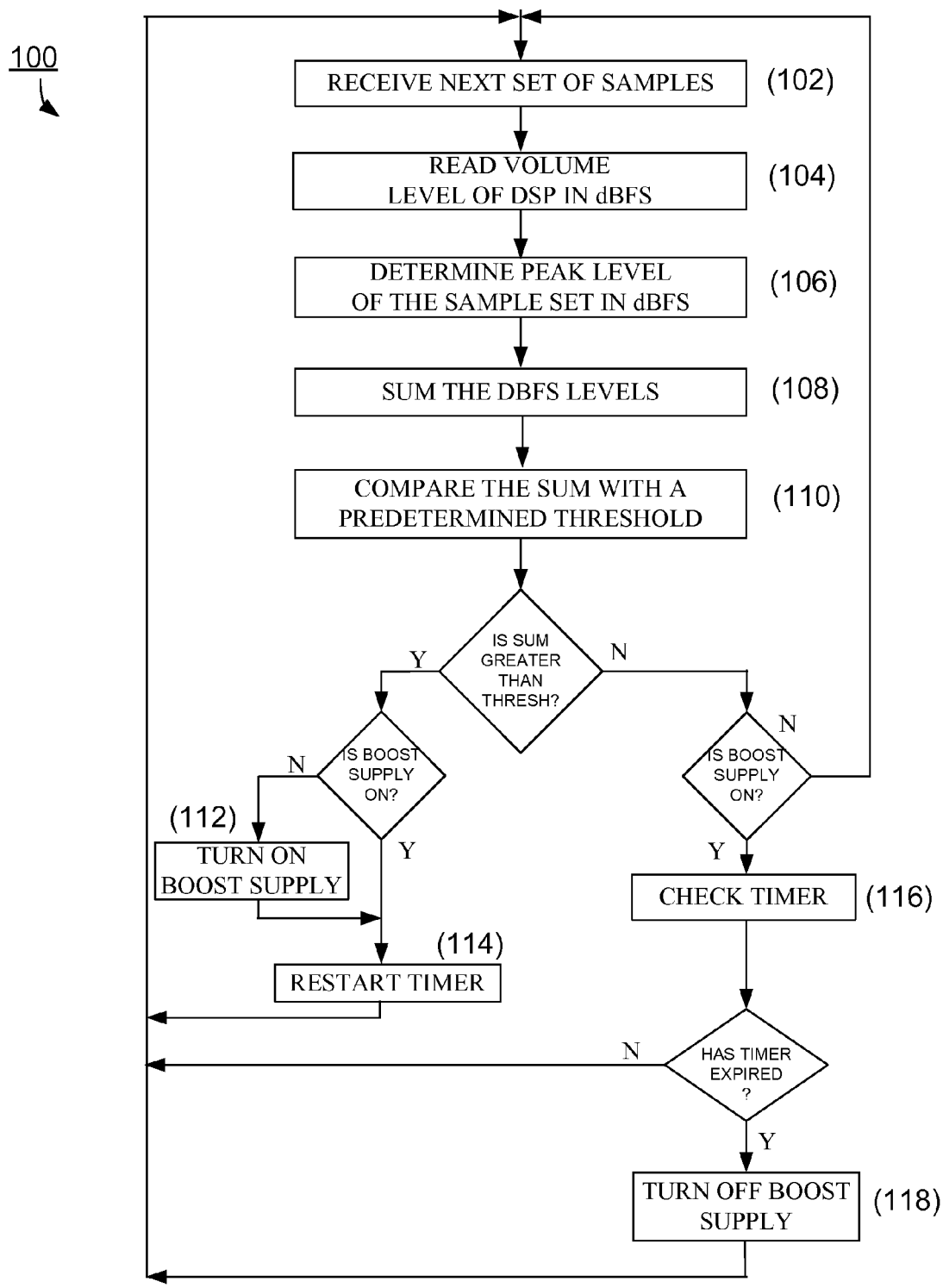
FIG. 5 is a flow diagram of an embodiment of a process for amplifying audio signals.

FIG. 5 shows an embodiment of a process 100 for switching on the boost supply 24 to boost one or more output channels (i.e., power amplifier chips 22) and switching off the boost supply 24 when boosting is deemed unwarranted. (It is to be understood that the boosting operation is what is turned on and off; the BOD supply 24 itself, more specifically, the boost controller 40, remains running (i.e., on) throughout the switching of the boost function on and off). In the description of this process 100, reference is made also to the elements of FIG. 1 and FIG. 2. The process 100 can operate on every incoming sample from the input source 16 or upon a group of incoming audio samples. For purposes of illustration, the following description of the process 100 is in connection with a group (or set) of incoming audio samples.

At step 102, the processor system 26 acquires a set of audio samples from the A/D converter 18. Before or while processing the set of audio samples, the processor system 26 reads (step 104) the volume level (in dBFS) of the DSP. The processor system 26 also determines (step 106) the peak level (in dBFS) in the set of incoming audio samples. The processor system 26 then sums (step 108) the two dBFS levels, and compares (step 110) the sum with a predetermined threshold (in dBFS). (An example of a process for predetermining this threshold is described in connection with FIG. 7 or FIG. 8). In one embodiment, the threshold is −20 dBFS. Until this threshold is reached, the BOD supply 24 passes the battery voltage from the power supply 14 through to the one or more power amplifier chips 22.

If the sum exceeds the threshold, the processor system 26 has determined that the one or more power amplifier chips 22 require a power boost for this particular audio sample. In response, if the boost supply is not presently on, the processor system 26 issues a high BOD_ON/OFF signal 66 that turns on (step 112) the boost supply. (In one embodiment, as shown previously in FIG. 2, a high BOD_ON/OFF signal 66 turns on the MOSFET switch 52, causing the boost controller 40 to switch to the boost voltage, and a low BOD_ON/OFF signal turns off the MOSFET switch 52, causing the boost controller 40 to pass through the battery voltage.)

If presently off when the high BOD_ON/OFF signal 66 is received, the BOD supply 24 responds by switching to provide the boost voltage (e.g., a regulated 24 V) to the one or more power amplifiers 22. If already on when the BOD_ON/OFF signal is received, the boost supply 24 continues to provide the boost voltage to the power amplifiers 22. The processor system 26 also resets and restarts (step 114) the timer 28 from time 0 ($t_0$). Accordingly, the timer 28 provides a sliding window that resets with each set of samples requiring the boost voltage.

If the result of the comparison indicates that the sum is less than the threshold, and the BOD supply 24 is presently off, the processor system 26 continues to issue a low BOD_ON/OFF signal 66 that keeps the BOD supply 24 turned off and acquires (step 102) the next set of audio samples for processing. Accordingly, the BOD supply 24 responds to the low BOD_ON/OFF signal 66 passing the voltage of the power supply 14 through to the one or more power amplifier chips 22. If, instead, the BOD supply 24 is presently on, the processor system 26 checks (step 116) the timer 28. If the timer 28 has expired, the processor system 26 issues a low BOD_ON/OFF signal 66 that turns off (step 118) the BOD supply 24. If the processor system 26 otherwise determines that the timer 28 has not expired, the process 100 returns to processing the next set of audio samples). Although this present set of audio samples does not need an output boost, the BOD supply 24 has too recently turned on for it now to be switched off.

Figure 6:
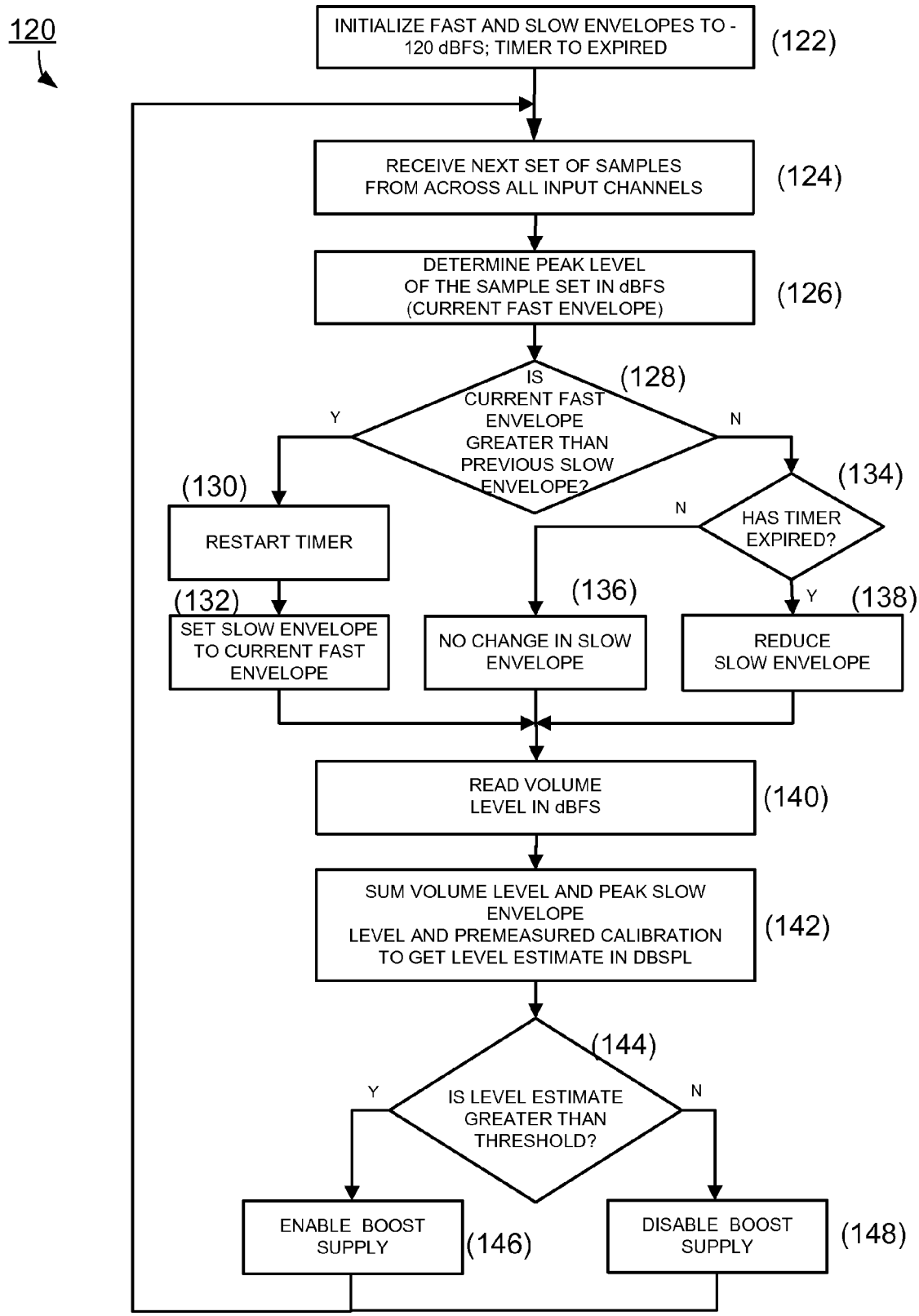
FIG. 6 is a flow diagram of another embodiment of a process for amplifying audio signals.

FIG. 6 shows another embodiment of a process 120 for switching on the boost supply 24 to boost one or more output channels (i.e., power amplifier chips 22) and switching off the boost supply 24 when boosting is deemed unwarranted. In the description of this process 120, reference is made also to the elements of FIG. 1 and FIG. 2. The process 120 operates on each frame of incoming audio samples. Initially, the timer 28 is set (step 122) as expired; and the peak levels of the slow and fast envelopes are set to −120 dBFS. In this embodiment, the timer 28 is embodied within the input level detector 78. The role of the timer 28, as previously described, is to provide a sliding window that resets with each set of samples requiring the boost voltage. This sliding window corresponds to a minimum duration for which the BOD supply 24 stays turned on in order to avoid turning the BOD supply 24 off too soon after being turned on.

The processor system 26 acquires (step 124) a set of audio samples from across all input channels that may be boosted from the A/D converter 18. The processor system 26 determines (step 126) the absolute value of the peak level (in dBFS) in the set of incoming audio samples, referred to as the current fast envelope. The processor system 26 then compares (step 128) the peak level of the current fast envelope with the peak level of a previous slow envelope (initially set to −120 dBFS). If the peak level of the current fast envelope is greater than the peak level of the previous slow envelope, the timer 28 is restarted (step 130); restarting the timer 28 ensures a minimum duration for keeping the boost supply on should this peak value causes the boost supply to turn on. In addition, the level of the slow envelope is set (step 132) to the peak level of the current fast envelope.

If, instead, at step 128, the peak level of the current fast envelope is less than or equal to the peak level of the previous slow envelope, the timer 28 is checked to see if it has expired (step 134). If the timer 28 has not expired, the peak level of the slow envelope remains unchanged (step 136). If the timer 28 has expired, the peak level of the slow envelope is reduced by a fixed amount. (step 138).

Before or while processing the set of audio samples, the processor system 26 reads (step 140) the volume level (in dBFS) of the DSP. The volume level, current peak level of the slow envelope, and an optional premeasured calibration value are summed (step 142) to obtain a level estimate (in dBSPL) for the set of incoming audio samples. At step 144, the resulting level estimate is compared to a predetermined boost threshold (in dBSPL). If the level estimate exceeds the boost threshold, the boost supply is enabled (step 146), otherwise, the boost supply is disabled (step 148).

Figure 7:
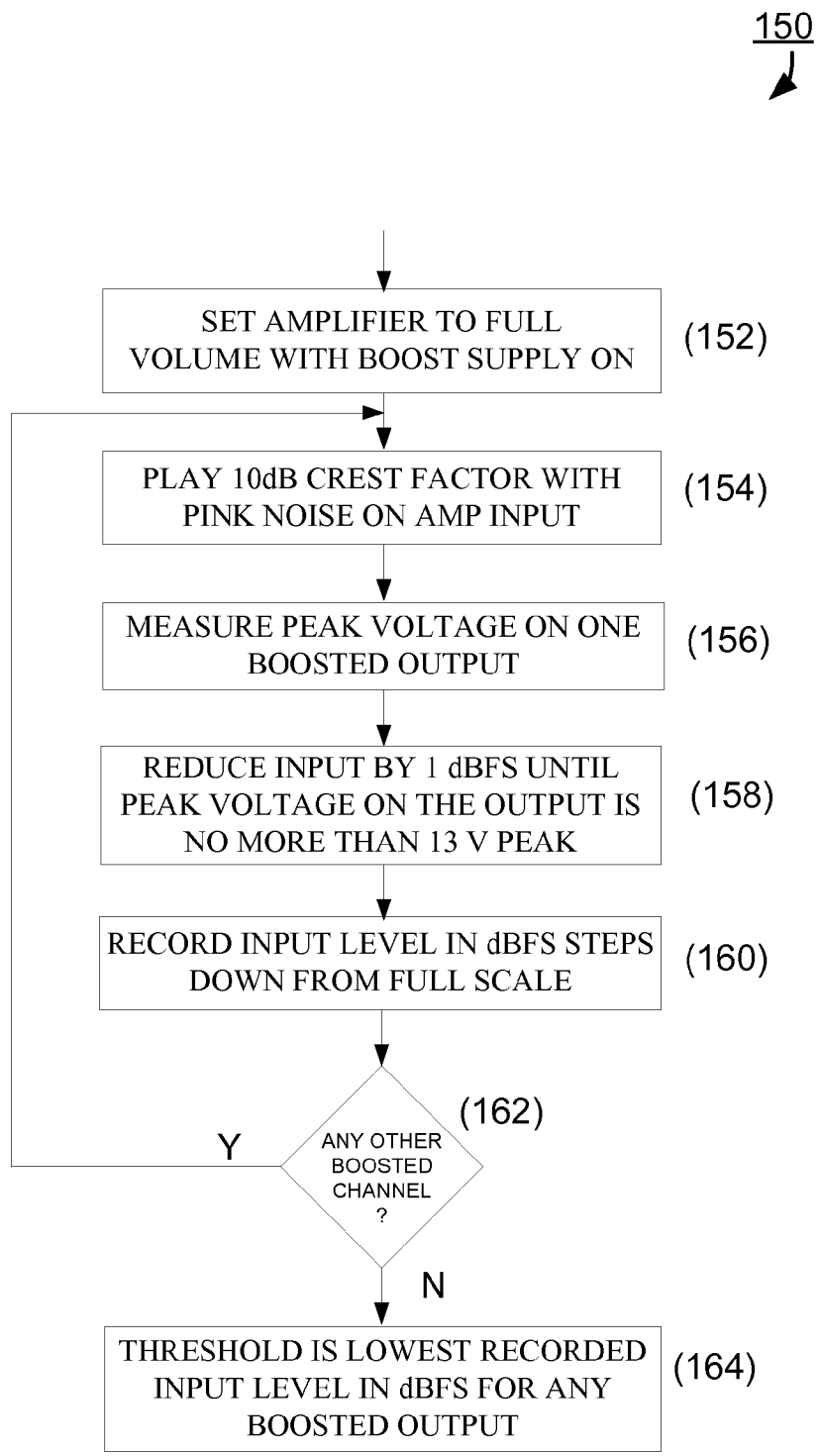
FIG. 7 is a flow diagram of an embodiment of a process for determining a threshold used as a trigger to supply a boosted voltage to one or more power amplifiers of the amplifier.

FIG. 7 shows an embodiment of a process 150 for determining the boost threshold for the boost-on-demand system 10. At step 152, the amplifier 12 is set to full volume, with the BOD supply 24 turned on. A 10 dB crest factor pink noise signal, with peak level reaching 0 dBFS, is played (step 154) on the input of the amplifier 12. Peak level is measured (step 156) on one boosted output (i.e., channel). The input signal is reduced (step 158), in one decibel increments, until the peak level on the boosted output no longer exceeds 13 volts peak (here, 13 volts is an example). Other finer or coarser increments than one decibel and higher or lower threshold voltages than 13 volts can be used without departing from the principles described herein. In response to the peak level on the boosted output no longer exceeding 13 volts, the level of the input signal is recorded (step 160), in the number of decibel steps, down from full scale. The process 150 repeats for each boosted output. The threshold to be used by the boost-on-demand system 10 for switching the BOD supply 24 on and off is the lowest input level recorded in step 160 for the boosted outputs.

Figure 8:
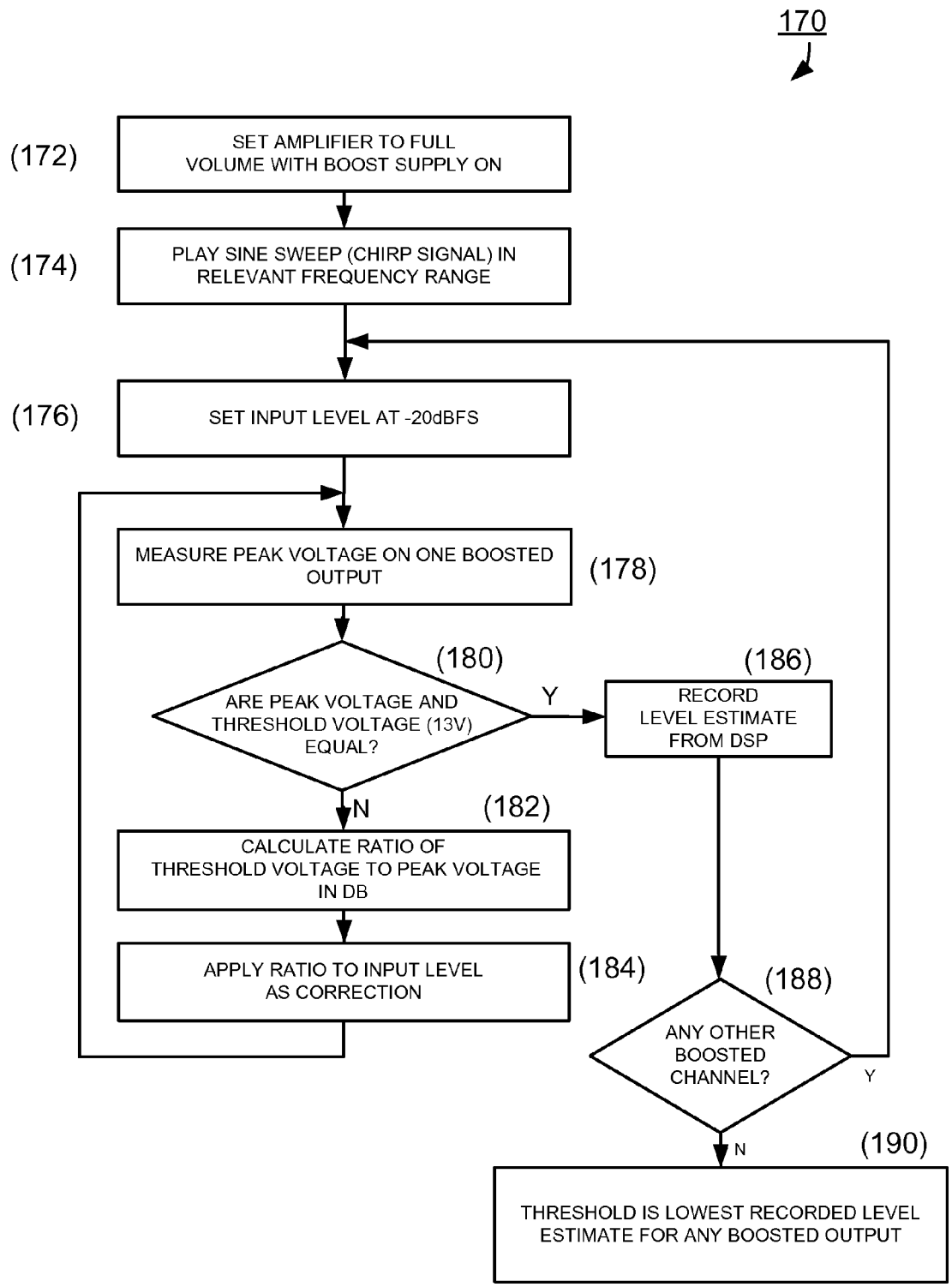
FIG. 8 is a flow diagram of another embodiment of a process for determining a threshold used as a trigger to supply a boosted voltage to one or more power amplifiers of the amplifier.

FIG. 8 shows another embodiment of a process 170 for determining the boost threshold for the boost-on-demand system 10. At step 172, the amplifier 12 is set to full volume, with the BOD supply 24 turned on. A sine sweep (chirp signal) within a relevant frequency range is played (step 174) on the input of the amplifier 12. The input level is set (step 176) at −20 dBFS. Peak voltage level is measured (step 178) on one boosted output (i.e., channel).

At step 180, the threshold voltage (e.g., predetermined at 13 v) and peak voltage level are compared. If the voltages are not equal, the ratio of the threshold voltage to the peak voltage is calculated (step 182) in dB. The ratio is applied (step 184) to the input level as a correction, and the process 170 returns to step 178. When the peak voltage and the threshold voltage are equal (at step 180), the level estimate is recorded (step 186) from the DSP. The process continues (step 188) with the next boosted channel, if any. When all boosted channels are evaluated, the boost threshold is set (step 190) to the lowest recorded level estimate for any of the boosted outputs.

Figure 9:
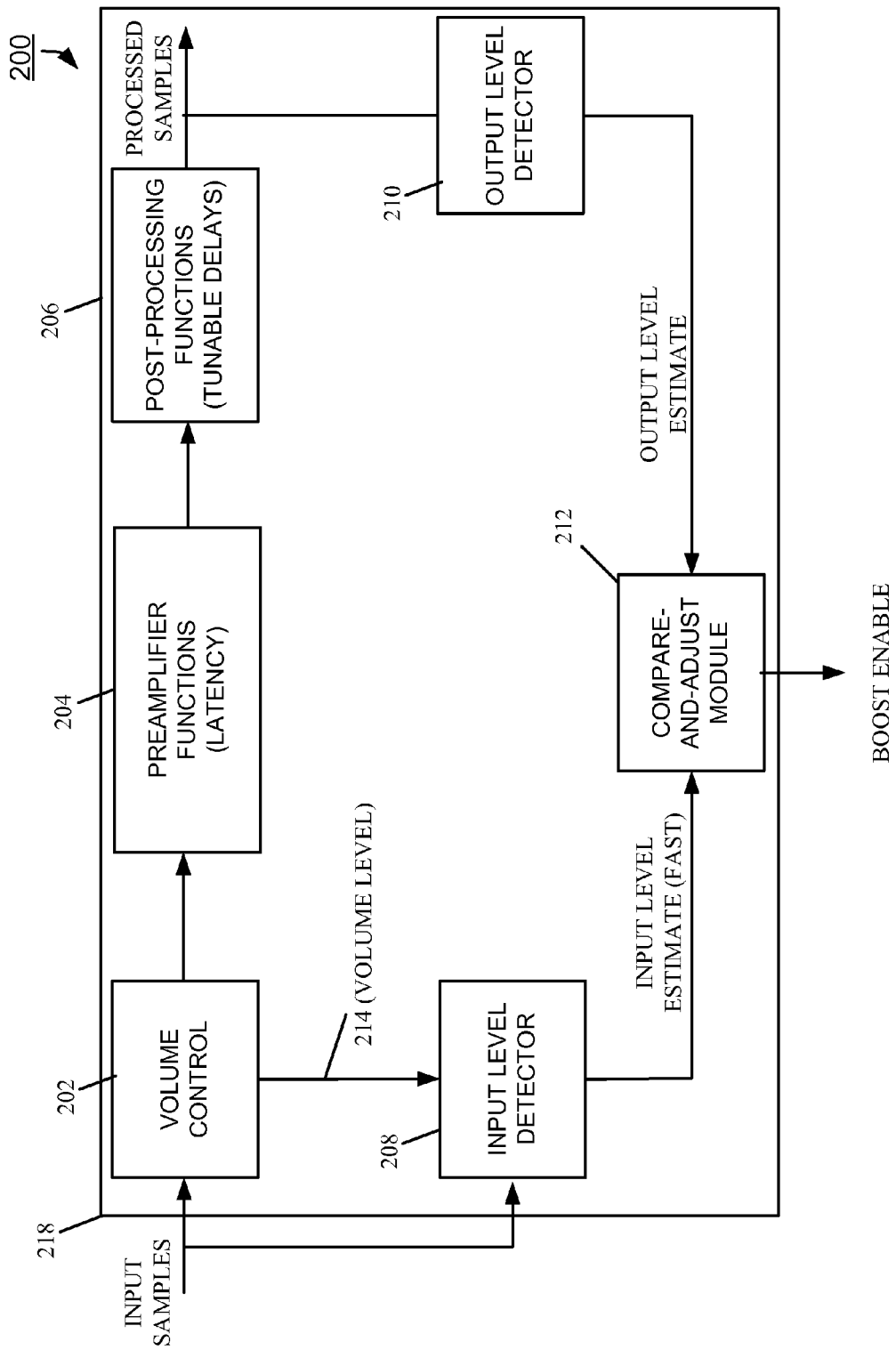
FIG. 9 is a block diagram of another embodiment of the processor system comprising a signal-processing pipeline having an input level detector configured to produce an input level estimate from incoming audio signals, an output level detector configured to produce an output level estimate from processed audio signals, and a compare-and-adjust module for determining whether to adjust the threshold used as a trigger to supply a boosted voltage to one or more power amplifiers of the amplifier.

FIG. 9 shows an embodiment of a processing system 200 for amplifying signals, comprising a signal-processing pipeline 218 that includes a volume control module 202, preamplifier functions module 204, a post-processing functions module 206. The processing system 200 further includes an input level detector 208 and an output level detector 210. Input samples pass to the volume control module 202 and the input level detector 208. The volume control module 202 provides the volume setting at which audio samples are to be played. The input level detector 208 receives the volume setting from the volume control module 202 and uses this volume setting to produce the input level estimate, referred to earlier as the "fast envelope" based on the incoming input audio samples.

The output level detector 210 is in communication with the output of the post-processing functions module 206. The output level detector is applied only to the channels on which boost-on-demand is implemented. The output level detector 210 produces an output level estimate based on the audio output produced by the post-processing functions module 206. Like the input level detector 208, output level detector 210 produces the maximum of peak value of all the channels in one audio frame.

The input level estimate and output level estimate are passed to a compare-and-adjust module 212, which may adjust the input boost threshold based on these level estimates, as described in more detail in connection with FIG. 10.

Figure 10:
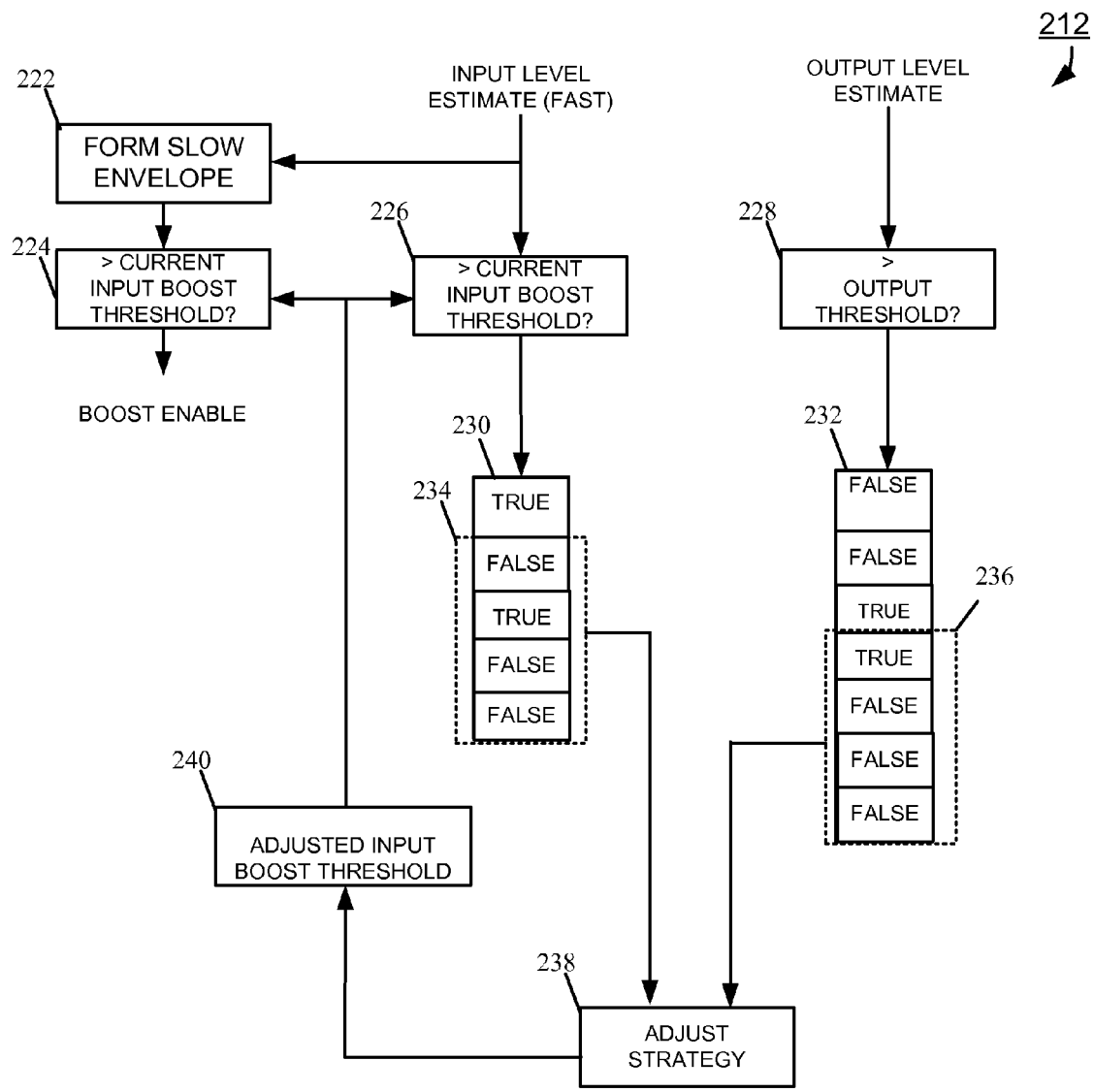
FIG. 10 is a block diagram of an embodiment of the compare-and-adjust module for adjusting a threshold used as a trigger to supply a boosted voltage to one or more power amplifiers of the amplifier.

FIG. 10 shows an embodiment of the compare and adjust module 212 for adjusting the boost threshold used as a trigger to supply a boosted voltage to one or more boosted channels of the amplifier. The input level detector 208 (FIG. 9) produces an input level estimate (fast envelope); similarly, the output level detector 210 (FIG. 9) produces an output level estimate. A slow envelope 222 is then formed by the compare and adjust module 212 from the input level estimate. This slow envelope 222 is compared (224) with the current input boost threshold. If the input boost threshold is exceeded, the processing system 200 enables the boost supply.

The input level estimate of the current fast envelope is also used to populate an input buffer 230. Each entry in the input buffer 230 is set to either "true" or "false" (e.g., 1 or 0) based on whether the input level estimate of the current fast envelope exceeds (226) the current input boost threshold. A "true" entry corresponds to an affirmative decision to boost the voltage; a "false" entry corresponds to a negative decision.

Similarly, the output level estimate is used to populate an output buffer 232. Each entry in the output buffer 232 is set to either "true" or "false" (i.e., a BOOLEAN value of either 1 or 0) based on whether the output level estimate exceeds (228) an output threshold, which is set according to the output level at which the boost supply is deemed necessary. This output threshold can be determined experimentally. A "true" entry in the output buffer 232 corresponds to an affirmative determination that a voltage boost is warranted for the corresponding frame of processed audio samples; a "false" entry corresponds to a negative determination.

Ideally, the buffer entries in the input buffer 230 are synchronized with those of the output buffer 232; that is, the correspondence between entries of the buffers 230, 232 is known—for example, the first entry in the input buffer 230 and the first entry on the output buffer 232 are known to correspond to the same set of audio samples. In such an instance, comparisons between corresponding buffer entries for a given frame of audio samples can be sufficient to determine whether the back end determination is consistent with the front end boost decision, and, if not, how to adjust the boost threshold.

Typically, the one-to-one correspondence between entries of the two buffers 230, 232 may not be certain. Accordingly, comparisons can be made between multiple entries in each buffer 230, 232. As illustrated, a set of input buffer entries, referred to as window 234, and a set of output buffer entries, referred to as window 236, are supplied to an adjust strategy module 238. The size of the windows 234, 236 provides tolerance for synchronizing input level estimates with output level estimates. In one embodiment, each window 234, 236 is four entries in size. Based on a comparison of the contents of these two windows 234, 236, a decision may be made to adjust the input boost threshold 240, as described in more detail in connection with FIG. 11. This adjusted input boost threshold 240 becomes the current input boost threshold used to determine future boost enable decisions and the state of subsequent entries in the input buffer 230.

Figure 11:
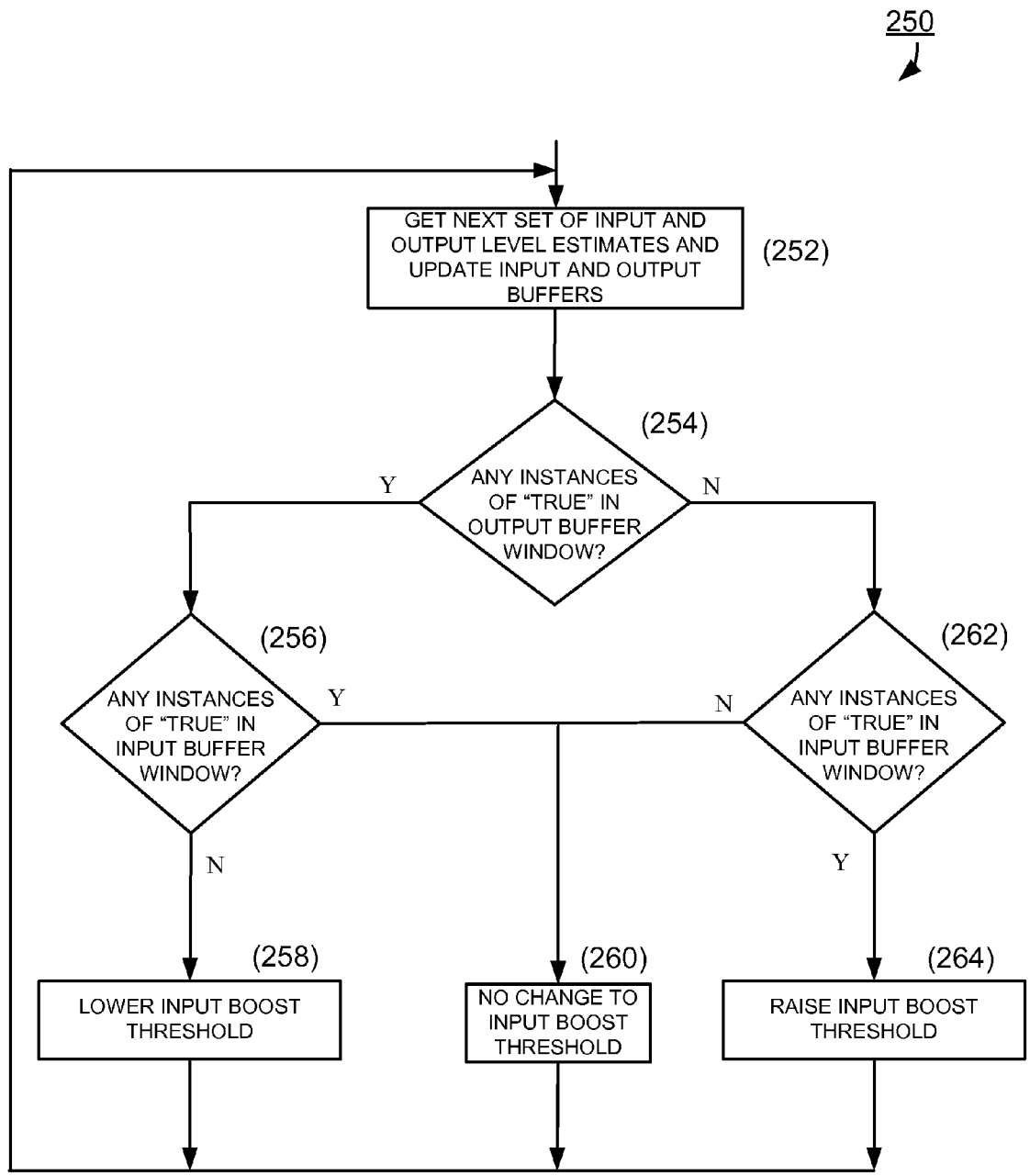
FIG. 11 is a block diagram of an embodiment of a process using the feedback mechanism of FIG. 10 to adjust the threshold used as a trigger to supply a boosted voltage to one or more power amplifiers of the amplifier.

FIG. 11 shows an embodiment of a process 250 used by the compare-and-adjust module 212 of FIG. 10 to tune the boost threshold 240 (FIG. 10) used as a trigger to supply a boosted voltage to one or more boosted channels of the amplifier. In the description of the process, reference is made to the elements of FIG. 10.

In brief overview, those entries in the input buffer window 234 are compared with those entries in the output buffer window 236; if the adjustable threshold is set correctly, then it is expected that the entries for each of the input and output level detectors will approximately track each other. If, though, one buffer window has one or more entries that signify the boost threshold has been exceeded, but the other buffer window has none, this indicates the boost threshold is either too high or too low; and the boost threshold is adjusted accordingly.

At step 252, the next sets of input and output level estimates are acquired; and the input buffer 230 and output buffer 232 are updated. At step 254, a window 236 of output buffer entries is examined to determine if any one of the entries is equal to "true", which indicates the current output level estimate exceeds the output threshold. If at least one buffer entry within the output buffer window 236 is true, a window 234 of entries in the input buffer 230 is examined (step 256). If none of the entries in the input buffer window 234 is true, then the input boost threshold is lowered (step 258) by a predetermined delta. This result signifies that the current input boost threshold was too high because the output detector 210 found an output level that warranted boosting, whereas the input level detector 208 did not. If, instead, at least one entry in the input buffer window 234 is true, then no change occurs (step 260) to the input boost threshold.

If, alternatively, at step 254, the output buffer window 236 has no entries equal to "true", then the input buffer window 234 is examined (step 262) for true entries. If none of the entries in the input buffer window 234 is true, then no change occurs (step 260) to the input boost threshold. If at least one entry in the input buffer window is true, then the input threshold is raised (step 264) by a predetermined delta. This result signifies that the current input boost threshold was too low because the output detector 210 did not find an output level that warranted boosting, whereas the input level detector 208 did. The process 250 continues with the next set of input and output level estimates.

The feedback mechanism described in connection with FIG. 10 and FIG. 11 can be employed as a separate tool to tune the boost threshold, where the output level detector 210 and the compare-and-adjust module 212 can be implemented outside of the amplifier. This tool is coupled to the amplifier in order to receive the output of the amplifier (i.e., the processed audio samples emerging from the post-processing module 206) and the input level estimate (fast envelope) produced by the input level detector 208. Then, by driving the amplifier with known input vectors, such as white noise, or sine sweeps, the tool can adjust an internal input boost threshold, using the process 250 described in FIG. 11, until the boost threshold converges to a stable value. This stable boost threshold value can then be used to configure the amplifier.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. A method for amplifying audio signals, the method comprising:
   processing, by a signal processor, incoming audio samples in preparation for amplification by an electronic amplifier circuit;
   receiving a voltage from a power supply;
   estimating, before the signal processor completes processing the incoming audio samples, an input level based on the incoming audio samples;
   determining, in response to a comparison between the estimated input level and a first threshold value, whether to boost the voltage received from the power supply;
   estimating, after the signal processor completes processing the incoming audio samples, an output level based on the processed audio samples; and
   determining, in response to the estimated output level, whether to adjust the first threshold value used to determine whether to boost the voltage received from the power supply, the determining of whether to adjust the first threshold value comprising:
      comparing the estimated output level with a second threshold value to determine whether the processed audio samples warrant a boosting of the voltage received from the power supply;
   comparing a result of the comparison between the estimated output level and the second threshold value with a result of the comparison between the estimated input level and the first threshold value; and
   adjusting the first threshold value if the results differ.

2. The method of claim 1, further comprising increasing the first threshold value if the result of the comparison between the estimated input level and the first threshold value indicates boosting of the voltage received from the power supply is warranted, but the result of the comparison between the estimated output level and the second threshold value indicates boosting of the voltage received from the power supply is unwarranted.

3. The method of claim 1, further comprising reducing the first threshold value if the result of the comparison between the estimated input level and the first threshold value indicates boosting of the voltage received from the power supply is unwarranted, but the result of the comparison between the estimated output level and the second threshold value indicates boosting of the voltage received from the power supply is warranted.

4. The method of claim 1, further comprising estimating a plurality of input levels and a plurality of output levels, each estimated input level being determined from a frame of incoming audio samples and each estimated output level being determined from a frame of processed audio samples, and wherein the determining whether to adjust the first threshold value comprises:
   comparing each estimated input level with the first threshold value to determine whether the frame of incoming audio samples from which that estimated input level is determined warrants a boosting of the voltage received from the power supply;

comparing each estimated output level with a second threshold value to determine whether the frame of processed audio samples from which that estimated output level is determined warrants a boosting of the voltage received from the power supply;

comparing a window of results of the comparisons between the estimated output levels and the second threshold value with a window of results of the comparisons between the estimated input levels and the first threshold value; and adjusting the first threshold value if one or more results in one window of results indicate boosting of the voltage is warranted, whereas all results in the other window of results indicate boosting of the voltage is unwarranted.

5. The method of claim 4, further comprising increasing the first threshold value if one or more results in the window of results of the comparisons between the estimated input levels and the first threshold value indicates boosting of the voltage received from the power supply is warranted, but all results in the window of results of the comparisons between the estimated output levels and the second threshold value indicate boosting of the voltage received from the power supply is unwarranted.

6. The method of claim 4, further comprising reducing the first threshold value if one or more results in the window of results of the comparisons between the estimated input levels and the first threshold value indicates boosting of the voltage received from the power supply is unwarranted, but all results in the window of results of the comparisons between the estimated output level and the second threshold value indicates boosting of the voltage received from the power supply is warranted.

7. The method of claim 1, further comprising determining the first threshold value based on tuning equalization of a plurality of electronic amplifier circuits configured to receive a boosted voltage.

8. The method of claim 1, wherein estimating an input level based on the incoming audio samples comprises determining a maximum input level from among the incoming audio samples.

9. The method of claim 8, wherein estimating an input level based on the incoming audio samples further comprises adding a volume level to the maximum input level.

10. The method of claim 1, further comprising boosting the voltage received from the power supply and supplying the boosted voltage to the electronic amplifier circuit if the estimated input level is greater than the first threshold value, and otherwise passing the voltage received from the power supply to the electronic amplifier circuit.

11. An amplifier comprising:
an electronic amplifier circuit;
a boost supply circuit receiving a voltage from a power supply, the boost supply circuit communicating with the electronic amplifier circuit to provide power thereto; and
a processor system processing incoming audio samples in preparation for amplification by the electronic amplifier circuit, the processor system including an input level detector, an output level detector, and a processor, the input level detector producing an input level estimate based on the incoming audio samples before the processor system completes the processing of the incoming audio samples, the output level detector producing an output level estimate, after the processor system completes the processing of the incoming audio samples, based on the processed audio samples, and the processor determining, in response to a comparison between the estimated input level and a first threshold value, whether to boost the voltage received from the power supply, and, in response to the estimated output level, whether to adjust the first threshold value by comparing the estimated output level with a second threshold value to determine whether the processed audio samples warrant a boosting of the voltage received from the power supply, comparing a result of the comparison between the estimated output level and the second threshold value with a result of the comparison between the estimated input level and the first threshold value, and adjusting the firs threshold value if the results differ.

12. The amplifier of claim 11, wherein the processor increases the first threshold value if the result of the comparison between the estimated input level and the first threshold value indicates boosting of the voltage received from the power supply is warranted, but the result of the comparison between the estimated output level and the second threshold value indicates boosting of the voltage received from the power supply is unwarranted.

13. The amplifier of claim 11, wherein the processor reduces the first threshold value if the result of the comparison between the estimated input level and the first threshold value indicates boosting of the voltage received from the power supply is unwarranted, but the result of the comparison between the estimated output level and the second threshold value indicates boosting of the voltage received from the power supply is warranted.

14. The amplifier of claim 11, wherein the input level detector produces a plurality of input level estimates and the output level detector produces a plurality of output level estimates, each input level estimates being determined from a frame of incoming audio samples and each output level estimate being determined from a frame of processed audio samples, and wherein the processor determines whether to adjust the first threshold value by:

comparing each estimated input level with the first threshold value to determine whether the frame of incoming audio samples from which that estimated input level is determined warrants a boosting of the voltage received from the power supply;

comparing each estimated output level with a second threshold value to determine whether the frame of processed audio samples from which that estimated output level is determined warrants a boosting of the voltage received from the power supply;

comparing a window of results of the comparisons between the estimated output levels and the second threshold value with a window of results of the comparisons between the estimated input levels and the first threshold value; and adjusting the first threshold value if one or more results in one window of results indicate boosting of the voltage is warranted, whereas all results in the other window of results indicate boosting of the voltage is unwarranted.

15. The amplifier of claim 14, wherein the processor increases the first threshold value if one or more results in the window of results of the comparisons between the estimated input levels and the first threshold value indicates boosting of the voltage received from the power supply is warranted, but all results in the window of results of the comparisons between the estimated output levels and the second threshold value indicate boosting of the voltage received from the power supply is unwarranted.

16. The amplifier of claim 14, wherein the processor reduces the first threshold value if one or more results in the window of results of the comparisons between the estimated input levels and the first threshold value indicates boosting of the voltage received from the power supply is unwarranted, but all results in the window of results of the comparisons between the estimated output level and the second threshold value indicates boosting of the voltage received from the power supply is warranted.

17. The amplifier of claim 11, wherein the first threshold value is determined based on tuning equalization of a plurality of electronic amplifier circuits configured to receive a boosted voltage.

18. The amplifier of claim 11, wherein the input level detector estimates an input level based on the incoming audio samples by determining a maximum input level from among the incoming audio samples.

19. The amplifier of claim 18, wherein the input level detector further estimates an input level based on the incoming audio samples by adding a volume level to the maximum input level.

20. The amplifier of claim 11, wherein the boost supply circuit boosts the voltage received from the power supply and supplies the boosted voltage to the electronic amplifier circuit if the estimated input level is greater than the first threshold value, and otherwise passes the voltage received from the power supply to the electronic amplifier circuit.

21. An automotive vehicle, comprising:
an input source of incoming audio samples;
a power supply supplying a voltage;
an amplifier in communication with the input source to receive the incoming audio samples therefrom and with the power supply to receive the voltage, the amplifier comprising:
  an electronic amplifier circuit;
  a boost supply circuit receiving a voltage from a power supply, the boost supply circuit communicating with the electronic amplifier circuit to provide power thereto; and
  a processor system processing the incoming audio samples in preparation for amplification by the electronic amplifier circuit, the processor system including an input level detector, an output level detector, and a processor, the input level detector producing an input level estimate based on the incoming audio samples before the processor system completes the processing of the incoming audio samples, the output level detector producing an output level estimate, after the processor system completes the processing of the incoming audio samples, based on the processed audio samples, and the processor determining, in response to a comparison between the estimated input level and a first threshold value, whether to boost the voltage received from the power supply, and, in response to the estimated output level, whether to adjust the first threshold value by comparing the estimated output level with a second threshold value to determine whether the processed audio samples warrant a boosting of the voltage received from the power supply, comparing a result of the comparison between the estimated output level and the second threshold value with a result of the comparison between the estimated input level and the first threshold value, and adjusting the first threshold value if the results differ.

22. The automotive vehicle of claim 21, wherein the processor increases the first threshold value if the result of the comparison between the estimated input level and the first threshold value indicates boosting of the voltage received from the power supply is warranted, but the result of the comparison between the estimated output level and the second threshold value indicates boosting of the voltage received from the power supply is unwarranted.

23. The automotive vehicle of claim 21, wherein the processor reduces the first threshold value if the result of the comparison between the estimated input level and the first threshold value indicates boosting of the voltage received from the power supply is unwarranted, but the result of the comparison between the estimated output level and the second threshold value indicates boosting of the voltage received from the power supply is warranted.

24. The automotive vehicle of claim 21, wherein the input level detector produces a plurality of input level estimates and the output level detector produces a plurality of output level estimates, each input level estimate being determined from a frame of incoming audio samples and each output level estimate being determined from a frame of processed audio samples, and wherein the processor determines whether to adjust the first threshold value by:
comparing each estimated input level with the first threshold value to determine whether the frame of incoming audio samples from which that estimated input level is determined warrants a boosting of the voltage received from the power supply;
comparing each estimated output level with a second threshold value to determine whether the frame of processed audio samples from which that estimated output level is determined warrants a boosting of the voltage received from the power supply;
comparing a window of results of the comparisons between the estimated output levels and the second threshold value with a window of results of the comparisons between the estimated input levels and the first threshold value; and
adjusting the first threshold value if one or more results in one window of results indicate boosting of the voltage is warranted, whereas all results in the other window of results indicate boosting of the voltage is unwarranted.

25. The automotive vehicle of claim 24, wherein the processor increases the first threshold value if one or more results in the window of results of the comparisons between the estimated input levels and the first threshold value indicates boosting of the voltage received from the power supply is warranted, but all results in the window of results of the comparisons between the estimated output levels and the second threshold value indicate boosting of the voltage received from the power supply is unwarranted.

26. The automotive vehicle of claim 24, wherein the processor reduces the first threshold value if one or more results in the window of results of the comparisons between the estimated input levels and the first threshold value indicates boosting of the voltage received from the power supply is unwarranted, but all results in the window of results of the comparisons between the estimated output level and the second threshold value indicates boosting of the voltage received from the power supply is warranted.

27. The automotive vehicle of claim 21, wherein the first threshold value is determined based on tuning equalization of a plurality of electronic amplifier circuits configured to receive a boosted voltage.

28. The automotive vehicle of claim 21, wherein the input level detector estimates an input level based on the incoming audio samples by determining a maximum input level from among the incoming audio samples.

29. The automotive vehicle of claim 28, wherein the input level detector further estimates an input level based on the incoming audio samples by adding a volume level to the maximum input level.

30. The automotive vehicle of claim 21, wherein the boost supply circuit boosts the voltage received from the power supply and supplies the boosted voltage to the electronic amplifier circuit if the estimated input level is greater than the first threshold value, and otherwise passes the voltage received from the power supply to the electronic amplifier circuit.

* * * * *